United States Patent [19]

Shimbo

[11] 4,393,574
[45] Jul. 19, 1983

[54] METHOD FOR FABRICATING INTEGRATED CIRCUITS

[75] Inventor: Masafumi Shimbo, Tokyo, Japan

[73] Assignee: Kabushiki Kaisha Daini Seikosha, Tokyo, Japan

[21] Appl. No.: 213,617

[22] Filed: Dec. 5, 1980

[51] Int. Cl.³ .................. H01L 21/205; H01L 21/208
[52] U.S. Cl. ..................... 29/571; 29/576 E; 29/577 C; 29/580; 148/171; 148/175
[58] Field of Search ................. 29/571, 576 E, 577 C, 29/580; 357/23; 148/175, 171

[56] References Cited

U.S. PATENT DOCUMENTS

| | | | |
|---|---|---|---|
| 3,439,414 | 4/1969 | Price ................................... | 148/175 |
| 3,514,845 | 6/1970 | Legat et al. ...................... | 148/175 X |
| 3,764,409 | 10/1973 | Nomura et al. ..................... | 148/175 |
| 3,905,037 | 9/1975 | Bean et al. ........................ | 148/175 X |
| 3,925,120 | 12/1975 | Saida et al. ........................... | 148/175 |
| 4,141,765 | 2/1979 | Druminski et al. ................ | 29/580 X |

*Primary Examiner*—G. Ozaki
*Attorney, Agent, or Firm*—Robert E. Burns; Emmanuel J. Lobato; Bruce L. Adams

[57] ABSTRACT

A method of fabricating integrated circuits comprises forming a concave portion having bottom and side faces on a semiconductor single-crystal substrate, forming an insulating film on the faces of the concave portion except for at least a portion of the bottom face, and forming a first semiconductor growth layer on the insulating film-free portion of the bottom face of the concave portion by chemical vapor deposition using a mixture gas containing semiconductor chloride and hydrogen such that the top surface of the growth layer is the same level as the upper face of the substrate in the region adjoining the concave portion. Semiconductor devices are then fabricated in the substrate and growth layer. Alternatively, the first growth layer can be formed on the substrate and thereafter a concave portion can be etched in the first growth layer and then a second semiconductor growth layer can be formed on the bottom face of the concave portion such that the top surfaces of the first and second growth layers are at the same level. In another variation, the first growth layer can extend above the substrate surface, and a second growth layer can be formed on the substrate such that the top surface of the second growth layer is at the same level as that of the first growth layer.

5 Claims, 15 Drawing Figures

METHOD FOR FABRICATING INTEGRATED CIRCUITS

BACKGROUND OF THE INVENTION

The present invention relates generally to a method for fabricating integrated circuits, and more particularly, to a fabricating method suitable to fabricate various types of integrated circuits, such as, an integrated circuit including various field effect transistors, an integrated circuit including field effect transistors and bipolar transistors, and an integrated circuit having transistors which are different in structural parameters, such as, impurity density, conductivity type, thickness of epitaxial growth layer, or the like.

There is presently the need for integrated circuits which exhibit the capabilities of multi-function, high speed and less power; however, due to the insufficiency of the characteristics of the transistors incorporated therein, circuits having the combination of transistors possessing the desired characteristics have not yet been. For example, the field effect transistors can be roughly classified into an insulation gate type (MIS) and a junction type (BJT) depending on the gate structure, and moreover, classified into static induction transistor (SIT) and an FET having a similar characteristic to that of a pentode. The bi-polar transistor is one kind of these transistors. Although the SIT has advantages of higher speed operation and lower power consumption, a low impurity density layer of less than $10^{15}$ cm$^{-3}$ is generally required. On the other hand, although the MIS.-FET has advantages of lower speed operation with lower power consumption of direct current, an impurity density layer of more than $10^{14}$ cm$^{-3}$ is generally required. In addition, it is said that the SIT and BJT have the feature of large capacity of current density, and that the SIT is good at a voltage regulating operation and the BJT is good at a constant current operation.

For example, in accordance with the foregoing facts, in integrated circuits for timepieces, it is desired to use a SIT for the crystal controlled oscillating portion and the higher speed frequency dividing portion, to use a MOS.FET for the lower speed frequency dividing portion and to use a BJT or SIT for the stepping motor driving portion. Moreover, it is easy to use the SIT and BJT for linear circuits, such as, a constant voltage source circuit, a circuit for constant current source or the like. Considering the SIT-IC as an example, for the channel portion alone, there are many structural to be considered factors, such as, the advantageous thickness and impurity density for obtaining the desired frequency characteristic, the advantageous thickness and impurity density for obtaining a large amplification factor or the like. It is preferable that SITs having various structural factors be incorporated into the same crystal in order to realize an integrated circuit having advantages of high efficiency, multi-function, precision and less consumption power.

The present invention provides a method for easily fabricating integrated circuit as described above, and more particularly, provides a method for forming semiconductor layers which are different from each other in impurity density, conductivity type and thickness in such a way that the surface levels of the layers are the same level.

To aid the understanding of the advantages of the present invention, fabricating, a conventional fabricating method will first be described in conjunction with FIGS. 1 and 2.

FIGS. 1(a) to 1(c) are sectional views illustrating steps for forming a vertical type of junction-type SIT and MOS.FET within the same chip. FIG. 1(a) is a sectional view in which an n+ region 11 is formed on one portion of an n-type Si substrate 10 with a density of approximately $10^{-15}$ cm$^{-3}$ and, for example, n− epitaxial layer 13 with a density of approximately $10^{13}$ cm$^{-3}$ is deposited. The n+ region 11 is a buried layer used for leading out a main electrode of the SIT in a later step, and the thickness of the n− epitaxial layer is between 5 to 20 [μm] but is selectable at any value in accordance with the desired performance characteristics.

FIG. 1(b) is a sectional view illustrating a concave portion $V_3$ used for forming an electrode in the n+ region 11 by selectively etching the Si using a mask of oxide film, and a concave portion V used for forming the MOS.FET in a later step. Since the portion $V_3$ is different in depth from the portion V, at least two etching processes are required and the depth of each of the portions should be the same as the thickness of the n− epitaxial layer 13. After this, a p+ gate region 14 of the SIT, a p+ source region 112 of the MOS.FET and a p+ drain region 111 of the MOS.FET are formed by using a p+ selective diffusion process. Then, an n+ source region 12 of the SIT and an n+ drain lead-out region 21 are formed by using an n+ selective difffusion process, and moreover the n+ source.drain region is formed within a preformed p well if an n-channel MOS.FET is needed.

FIG. 1(c) is a sectional view showing a drain electrode 1, a source electrode 2 and a gate electrode 4 of the SIT, and electrodes 104, 102, 101 of the MOS-FET which are formed by selective etching process and evaporation for the windows and metal portions of each electrode. It is a difficult task to align the mask for each surface in order to form the SIT and MOS.FET. Although the exposing process is generally carried out under the condition of a tightly applied mask and resist coated over the wafer surface, in the above described step, the exposing process using the tightly applied mask is impossible due to the difficulty in masking the concave portions so that high accuracy patterns cannot be attained. Recently, a projection exposing process has been employed, however, due to the depth of the focus, the accuracy is not so improved when the top face and the bottom face of the concave portion V are exposed at the same time. Moreover, non uniformity of thickness of the photo-resist, cutting-off of the metal wiring persistent and so on are which still need problems to be solved in the future. Of course, without limitation of the example shown in FIG. 1, various values are selectable for the conductivity type of each region, impurity density, thickness or the like, however, the above described problems have not yet been solved. The fabrication steps are not so simple. Furthermore, there are examples employing a deep diffusion other than the method shown in FIG. 1(c), in which the n+ buried layer 11 is led out through the deep concave portion $V_3$. However, this is not always preferable because a long duration heating step is required.

To remove the above described disadvantages and problems, a conventional method called a buried epitaxial growth method has been developed. Steps of the method are illustrated in FIGS. 2(a) and 2(b), in which epitaxial growth is carried out after an insulation film 7 is deposited on a substrate 10 and an opening is defined in the insulation film 7 to form concave portion V (FIG. 2(a)). At this time, as shown in FIG. 2(b), the concave portion V is completely filled with a single-crystal growth layer 13 and polycrystal growth layer 33 is deposited on the insulation film 7 at the same time. In this method, there is a likelihood that a projected region 23 is formed around the edge of the concave portion V by protruding the single-crystal growth layer 13 and growing in a vertical direction. To make the surface flat again, the polycrystal growth layer 33 and the projected region 23 should be removed by polishing them from the surface to the inner portion with relatively high speed. During polishing, however, the substrate will be scratched. To omit the step of polishing, it has been attempted to form the insulation film 7 in the form of an over-hang to the concave portion V or to process it by a chemical vapor deposition (CVD) method including HC1. However, it is impossible to fill up the concave portions, each of which has a different depth, at the same time and to obtain a flat surface. To overcome this drawback, various methods, for example, as disclosed in Japanese Patent Application Nos. 63031/79 and 63032/79, have been proposed. However, limitation of size is required since these methods require that the surface of the substrate be a low figure surface orientation, such as (111), (113), (112) or the like and the width of the concave portion be more than two times the interval of the produced growth nucleations to attain remarkable effect.

The present invention has been made in order to overcome the drawbacks of the conventional methods, and one object of the present invention is to provide a fabricating method which comprises forming more than two regions each of which is different in impurity density, conductivity type and/or thickness in such a way that the surface levels of these regions become the same surface level and fabricating semiconductor devices in each of the regions.

Another object of the present invention is to provide a fabricating method, in which a photo-lithography is easily and precisely carried out because the different regions have the same surface level. A further object of the present invention is to provide a method for easily fabricating integrated circuits, in which transistors having structural factors suitable for imparting the desired characteristics are incorporated into the same crystal. As a result, the semiconductor device which is composed of more than two chips by the prior art can be realized as one chip device, and higher performance can be obtained.

The different regions described above are formed by more than one time of selective epitaxial growth under the use of a mask made of an insulation film (SiO$_2$) or nitricle film (Si$_3$N$_4$). At this time, the mask covers at least the upper surface and the side face of the concave portion. Consequently, the projected region 23 shown in FIG. 2(b) is not formed, and moreover, since a selective epitaxial growth can be made by the CVD method using a mixture gas containing semiconductor chloride and hydrogen, the growth can be carried out without deposition of polycrystal on the insulating film. Other advantages are that the duration of the heating process can be shortened, it is suitable for fine working, and the occurrences of cutting-off of the metal wire and non-uniformity of the film thickness of the photo-resist can be effectively removed since the unevenness of the surface is small as compared with the conventional one and a leading-out region for the buried layer and a region providing isolation between the elements can be formed.

In addition, the crystal surface may be the lower figure surface or a surface deviated therefrom, and is freely selected without any limitation.

The present invention will be now described in more detail in conjunction with the drawings.

Figure 1A:
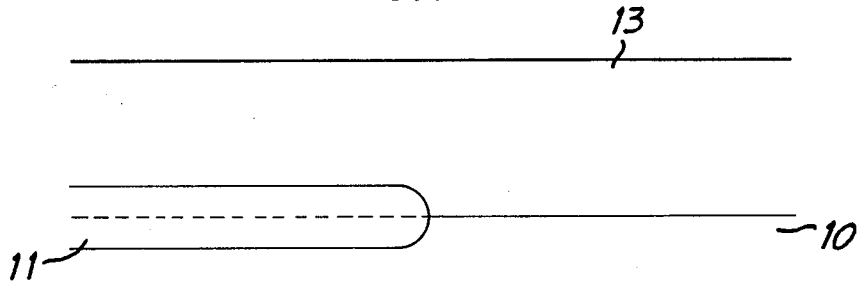
FIGS. 1(a) to 1(c) are sectional views illustrating the fabricating steps in the case that a SIT and MOS.FET are fabricated on the same chip by a conventional method.
Figure 1B:
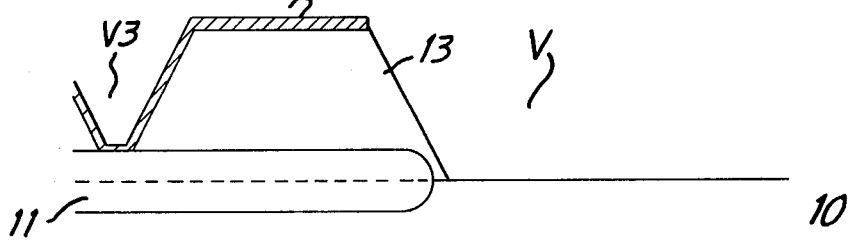
Figure 1C:
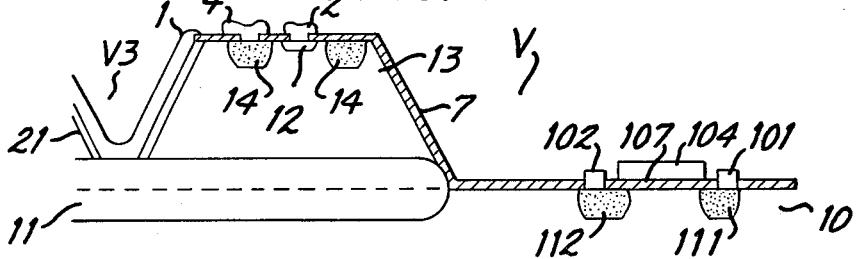
Figure 2A:
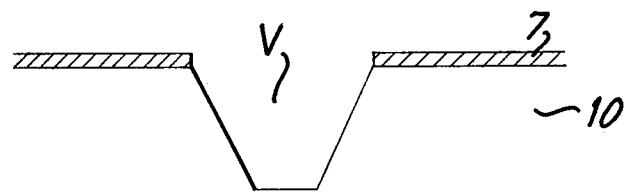
FIGS. 2(a) and 2(b) are sectional views illustrating an epitaxial growth for burying in accordance with a conventional method; and, FIGS. 3(a) to 3(c), 4(a), 4(b) and 5(a) to 5(e) are sectional views illustrating the fabricating steps in the case that integrated circuits having SIT and MOS.FET, and SIT and BJT, respectively, are fabricated in accordance with the present invention.
Figure 2B:
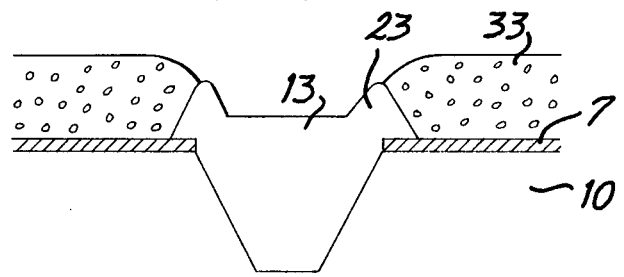
Figure 3A:
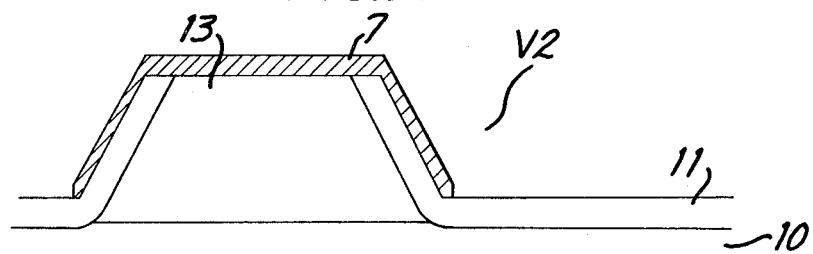
Figure 3B:
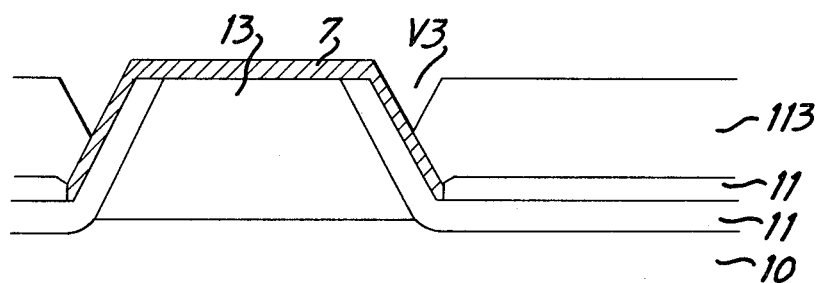
Figure 3C:
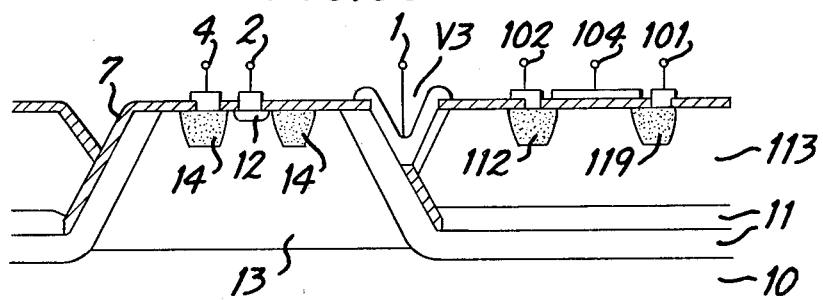

FIGS. 3(a) to 3(c) are sectional views illustrating the steps of one example of fabricating method of the present invention. FIG. 3(a) is a sectional view illustrating the steps, in which after an n$^-$ expitaxial layer 13 is formed on all of the surface of a Si n$^+$ substrate 10, a concave portion V$_2$ is formed by a conventional selective etching technique, such as, a low temperature dry etching involving a plasma etching and an ion etching, a gas etching using HCl +H$_2$ or the like, an etching using a HF, an etching using an alkali aqueous solution, for example, APW, and so on, n$^+$ buried layers 11 are formed on the side faces and the bottom face of the concave portion V$_2$ by a selective diffusion, the top surface of the concave portion V$_2$ (the surface of the n$^-$ epitaxial layer 13) and the side face thereof are covered with an insulation film 7 such as SiO$_2$, and an opening which reaches at least the bottom face is made in the epitaxial layer. In FIG. 3(b), for example, an n-type epitaxial layer 113 is furthermore formed by a selective growth in such a way that the surface level thereof is the same as that of the n$^-$ epitaxial layer 13. At this time, since the insulation film 7 which is used as mask for the selective growth process covers over the side face of the concave portion V$_2$, the projected portion at the mask end portion acts so as to fill the concave portion V$_2$ and no projected portion is formed on the surface while a shallow concave portion V$_3$ is formed, Due to an auto-doping or an impurity diffusion at the selective growth, the n$^+$ buried layer 11 rises on the side of the n-type epitaxial layer 113. The selective growth in this case is carried out in good condition, and the area covered with the insulation film 7 is less than in the conventional case. For example, when the mixture gas of SiCl$_4$'H$_2$ (Mol ratio of SiCl$_4$ is equal to or more than 0.5%) is used under the temperature between 1000° and 1150° C., the maximum width of the insulation film 7 is not more than 1 [mm] and no polycrystal layer is deposited on the insulation layer 7. The sufficient thickness of the insulation film 7 is approximately more than 1000[A°], however, a thermal oxidation film or a CVD film is generally used for the value of more than 5000 A°. After this, transistors are formed in each of the regions by the usual technique, for example, a vertical type SIT (n$^+$ source region 12, p$^+$ gate region 14) is formed in the n$^-$ epitaxial layer 13 and a p-channel MOS.FET (p$^+$ source region 112, p$^+$ drain region 119, gate electrode 104) is formed in the n-type epitaxial layer 113.

FIG. 3(c) illustrates the sectional view thereof. There is shown the buried layer 11 which is led out through the n+ diffusion layer on the side face of the concave portion $V_2$ from the concave portion $V_3$. According to the invention, and IIL type SITL or integrated circuit thereof other than a SITL may also be formed in the n⁻ epitaxial layer 13, and it is easily understood that a bipolar transistor, FET, any other transistor or circuit thereof may also be formed therein. A p-type layer may be employed instead of an n-type epitaxial layer 113, and an n-channel MOS transistor, p-channel SIT, FET or the like may be incorporated thereinto. A p+ buried layer can be used instead of n+ buried layer 11, and moreover, opposite conductivity type of impurity may be subjected to a diffusion, an epitaxial growth on the side face and the bottom face of the concave portion $V_2$. These modifications and variations may be selected in accordance with the structure and the characteristics of the desired integrated circuit.

In the above description, a method of fabricating the integrated circuit which requires two or more than two epitaxial layers which are different in impurity density or conductivity type has been described.

Figure 4A:
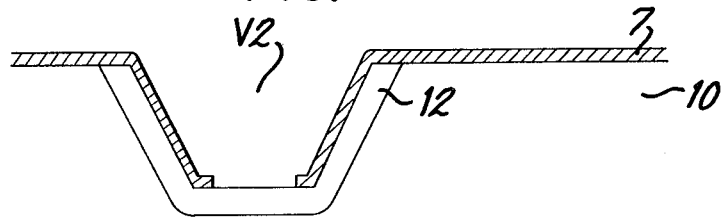
Figure 4B:
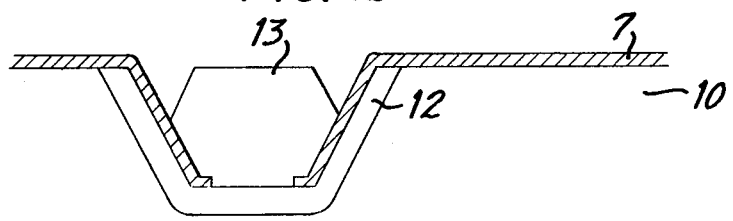

FIGS. 4(a) and 4(b) show a fabricating method suitable for the case that both the portion close to the surface of the substrate 10 and the epitaxial layer are used, for example, to form a junction type transistor and MOS transistor.

FIG. 4(a) is a sectional view, in which, after a concave portion $V_2$ is formed on a substrate (e.g. p type), an n+ buried layer 12 (for example, will be n+ source region in later step) is formed on the side face and the bottom face of the concave portion $V_2$ by a diffusion process, and an opening is defined in at least one portion of the bottom of an oxide film 7. After this, if a selective epitaxial growth is carried out in a similar way to the former embodiment, the growth layer 13 will be formed in such a way that the surface level of the layer 13 is the same as that of the substrate 10 and only a minor shallow concave portion is left. Such a condition is shown in FIG. 4(b). As described above, an upward type junction type SITL or I²L type SITL can be formed in the n⁻ growth layer 13 and it is easy to incorporate a n-channel MOS.FET or integrated circuit thereof into the surface of the substrate 10. The particular conductivity and impurity density of the substrate, the buried layer 12 and the growth layer 13 can be properly selected in accordance with the kind of integrated circuit element and design value desired.

FIG. 5 is sectional view illustrating another application example of the present invention, and the case in which the present invention is applied to an integrated circuit having SIT and BJT will be especially described.

Figure 5A:
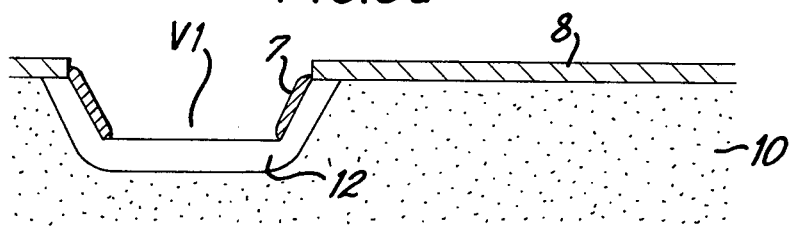

FIG. 5(a) is a sectional view illustrating the step, in which a first concave portion $V_1$ is formed on a p-type substrate 10 by the use of a mask made of $Si_3N_4$ film 8, a buried layer 12 is formed on the bottom face of the side face of the first concave portion $V_1$ by the use of a mask of $Si_3N_4$ film 8 as it is subjected to an oxidation and a selective diffusion at the same time, and then only the oxide film 7 on the bottom face of the first concave portion $V_1$ is removed. To remove the oxide film 7 on the bottom portion of the first concave portion $V_1$, a usual photo-lithography, ion etching, directional plasma etching and so on can be used.

Figure 5B:
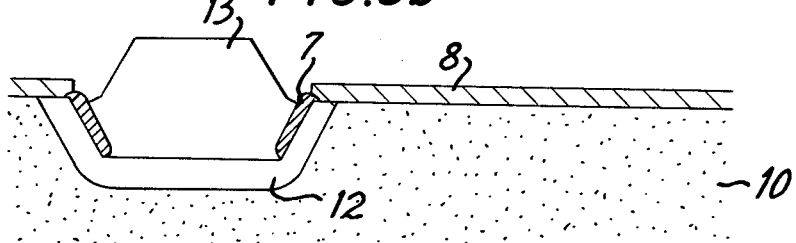
Figure 5C:
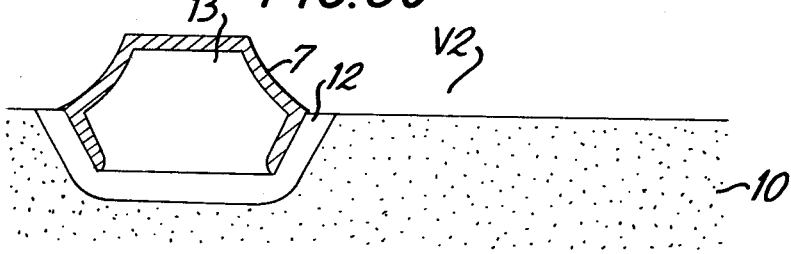
Figure 5D:
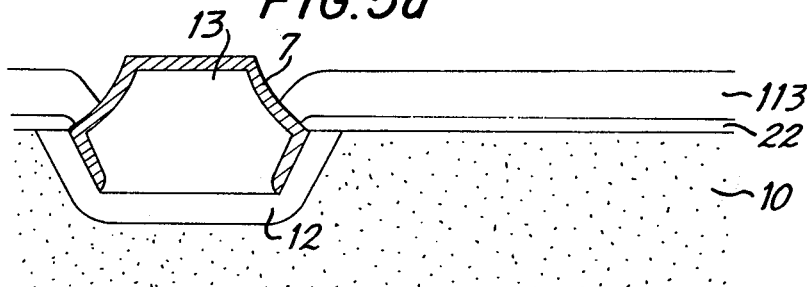
Figure 5E:
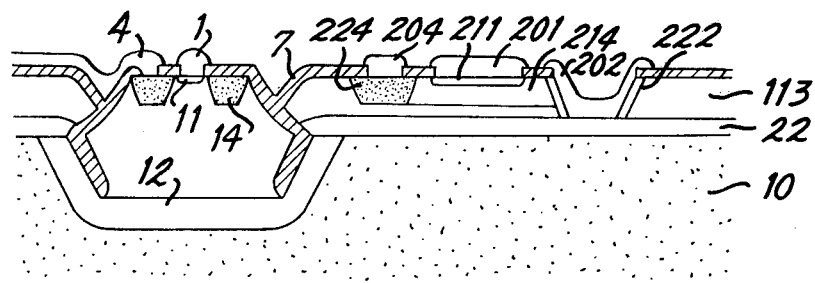

FIG. 5(b) is a sectional view illustrating the step in which a growth layer 13 with a thickness of, for example, 8μm is formed so as to be thicker than the depth of the first concave portion $V_1$, (for example, 5μm) by the above-mentioned epitaxial growth process, and for example, a projected portion (relatively concave portion $V_2$) with a width of 20μm is formed. In this case, the impurity density of the n⁻ growth layer 13 is determined at $5 \times 10^{13}$ cm⁻³. After this, as illustrated in FIG. 5(c), a selective oxidation is made by the use of a $Si_3N_4$ film 8 to form an oxide film 7 on the surface and side face of the n⁻ growth layer 13 and then the $Si_3N_4$ film is removed. FIG. 5(d) is a sectional view illustrating the step in which a selective epitaxial growth is made, for example, an n+ growth layer 22 with 0.5μm thickness (whose impurity density is, for example, $1 \times 10^{19}$ cm⁻³) and, for example, an n growth layer 113 with 2.5μm thickness (a hoseimpurity density is, for example, $1 \times 10^{15}$ cm⁻³) are formed on the portion except for the n⁻ growth layer 13. A selective epitaxial growth can be easily performed since the portion masked with oxide film 7 is small.

After the steps described above, as illustrated in FIG. 5(e), an upward type SIT the n+ source region of which is the buried layer 12 may be formed by forming a p+ gate region 14 and a n+ drain region 11 in the n⁻ growth layer 13, and an upward type npn BJT an emitter region of which is the n+ growth layer 22 may be also formed by forming a p base region 214 and a p+ base region 224 and an n+ collector region 211 in an n growth layer 113. In this case, an electrode 202 for the n+ buried layer 12 is formed through an n+ growth layer 22 and an n+ region 222. With this embodiment of the present invention, a lower density region required for the SIT and a thin and relatively lower density region suitable for the BJT are formed in such a manner that the surface level of the region for the SIT is equal to that of the region for the BJT. As a result of which, an integrated circuit, in which advantages of a high frequency characteristic of the SIT and a constant current characteristic of the BJT are effectively used, can be easily fabricated by fine working, and can be realized without cutting-off of metal wire, and without deviation of the distribution of the thickness of resist film.

In the embodiments of the present invention, a selective growth is carried out one or two times; however, since it is easily understood from the above description that this number of times is freely selectable in accordance with the purpose to be achieved, the a detailed explanation thereof will be omitted. Impurity density, conductivity type and thickness of the growth layer are freely selectable in accordance with the objects to be carried out, the presence or not of buried layer, the conductivity type thereof, or resistivity thereof is also selectable. As seen from the example of FIG. 5, the buried layer 12 on the side face of the concave portion is used as a diffusion layer for isolation, and moreover, the insulation film (in this case, oxide film 7) has been also buried. As a result, it is also used as one of the isolating layers and the diffusion layer 12 can be sometimes omitted. Therefore, it is greatly advantageous for realizing a high density packing.

The present invention has been described for Si semicoductors, however, the present invention is also applicable to other semiconducting materials, such as, Ge, Ga As, Ga P, In Ga P, Ga Al As and so on, [for which a selective growth process can be effected by the use of chloride material.] The same effect can be attained when a liquid growth is employed.

According to the above-mentioned method, by the use of a device parameter which realizes a high performance semiconductor device, the semiconductor devices can be easily fabricated with higher packaging density on the same chip, so that the industrial value of the present invention is remarkably high.

What is claimed:

1. A method for fabricating integrated circuits comprising the steps of:
    forming a concave portion having bottom and side faces on a semiconductor single-crystal substrate;
    forming an insulating film on the faces of said concave portion except for at least one portion of the bottom face of said concave portion;
    forming a first semiconductor growth layer on the bottom face of said concave portion which is free of the insulating film by chemical vapor deposition using a mixture gas containing semiconductor chloride and hydrogen such that the top surface of the growth layer is at the same level as the upper face of the substrate in the region adjoining said concave portion; and,
    fabricating semiconductor devices in said substrate and said growth layer.

2. A method for fabricating integrated circuits comprising the steps of:
    forming a first semiconductor growth layer on a semiconductor single-crystal substrate by chemical vapor deposition using a mixture gas of semiconductor chloride and hydrogen; selectively etching the first semiconductor growth layer to form therein a concave portion having bottom and side faces;
    forming an insulating film on at least one side face of the concave portion;
    forming a second semiconductor growth layer on the bottom face of the concave portion, the second semiconductor growth layer being separated from the first semiconductor growth layer by said insulating film and the top surface of the second semiconductor growth layer being at the same level as the top surface of the first semiconductor growth layer; and
    fabricating semiconductor devices in said substrate and first and second growth layers.

3. A method for fabricating integrated circuits comprising the steps of:
    forming a concave portion having bottom and side faces on a semiconductor single-crystal substrate;
    forming an insulating film on the faces of the concave portion except for at least one portion of the bottom face of the concave portion;
    forming a first semiconductor growth layer on the bottom face of the concave portion which is free of the insulating film by chemical vapor deposition using a mixture gas of semiconductor chloride and hydrogen such that the top surface of the growth layer extends a given distance above the upper surface of the substrate;
    forming a second semiconductor growth layer on the substrate such that the top surface of the second semiconductor growth layer is at the same level as the top surface of the first semiconductor growth layer; and
    fabricating semiconductor devices in said substrate and first and second growth layers.

4. A method for fabricating integrated circuits as claimed in claim 1, 2 or 3; wherein said step of fabricating semiconductor devices comprises fabricating at least one insulated gate type field effect transistor in said substrate and fabricating at least one bi-polar transistor or junction type field effect transistor in said first growth layer.

5. A method for fabricating integrated circuits as claimed in claim 2 or 3; wherein said step of fabricating semiconductor devices comprises fabricating a junction type field effect transistor in said first growth layer and fabricating a field effect transistor or a bi-polar transistor in said second growth layer.

* * * * *